United States Patent [19]

Brotz

[11] Patent Number: 4,676,996
[45] Date of Patent: Jun. 30, 1987

[54] METHOD OF PRODUCING A FOAMED MULTIPLE THERMOCOUPLE

[76] Inventor: Gregory R. Brotz, P. O. Box 1322, Sheboygan, Wis. 53081

[21] Appl. No.: 900,899

[22] Filed: Aug. 27, 1986

Related U.S. Application Data

[60] Division of Ser. No. 612,718, May 21, 1984, Pat. No. 4,626,612, which is a continuation-in-part of Ser. No. 588,344, Mar. 12, 1984, Pat. No. 4,628,143.

[51] Int. Cl.⁴ .............................................. B05D 5/12
[52] U.S. Cl. .................................... 427/113; 136/200; 136/201; 136/205; 136/224; 29/573; 427/119; 427/222; 427/224; 264/29.1
[58] Field of Search ............... 427/113, 119, 222, 224; 136/201, 206, 205, 224; 29/573; 264/29.1, 41, 45.3, 45.1

[56] References Cited

U.S. PATENT DOCUMENTS 3,285,018  5/1963  Henderson ........................... 136/239
3,922,334  11/1975  Marek ................................. 264/29.1
4,459,428  7/1984  Chou .................................. 135/224

*Primary Examiner*—John D. Smith
*Assistant Examiner*—Vi D. Dang
*Attorney, Agent, or Firm*—William Nitkin

[57] ABSTRACT

A method of producing a multiple thermocouple having a conductive open-cellular foam matrix, a portion of which forms a first pole with a plurality of discrete conductors of a different material from the foam matrix embedded in the foam having a portion of each of the discrete conductors being exposed on the insides of the cells of the foam forming a plurality of thermocouples. The remaining surface area inside the foam's cells not having an exposed discrete conductor thereon can be insulated. A second pole member is provided. Means to contact the discrete conductors in the foam and convey current produced by the thermocouples to the second pole of the thermocouple completes the multiple thermocouple. Such means to contact the discrete conductors can provide the heat to excite the thermocouples or such heat can come from other sources.

5 Claims, 14 Drawing Figures

METHOD OF PRODUCING A FOAMED MULTIPLE THERMOCOUPLE

This application is a divisional of my previously filed application for a Foamed Multiple Thermocouple, filed 05/21/84, Ser. No. 612,718 now U.S. Pat. No. 4,626,612 which is a continuation-in-part of my previously filed application for a Foamed Nuclear Cell filed 03/12/84, Ser. No. 588,344 now U.S. Pat. No. 4,628,143.

BACKGROUND OF THE INVENTION

1. Field of the Invention

The present invention relates to a method of producing a novel thermoelectric material, and more particularly relates to a method of producing a foamed multiple thermocouple.

2. History of the Prior Art

Multiple junction thermoelectric devices or thermocouples are known in the prior art. Examples of patents disclosing such devices are as follows:

U.S. Pat. No. 3,256,701 : Henderson
U.S. Pat. No. 3,269,871 : Kilt et al
U.S. Pat. No. 3,285,018 : Henderson et al
U.S. Pat. No. 3,343,373 : Henderson et al
U.S. Pat. No. 3,358,162 : Krake et al
U.S. Pat. No. 3,780,425 : Penn et al
U.S. Pat. No. 3,821,053 : Wilcox

SUMMARY OF THE INVENTION

It is an object of this invention to create multiple thermocouples within a foamed structure with one pole of the thermocouple ultimately being the basic structure of the foam and the second pole contacting discrete elements embedded internally within the foam by an ionized flame from combustion. The basic theories of thermocouples are well known in the art and since an increase in size of a total single contact area has no effect on the thermocouple's output, it has long been desired and strived for to find ways of creating multiple junctions within a thermocouple. The creation of such multiple junctions has been accomplished through many different methods as disclosed by the prior art, but the object of this invention is to disclose a totally unique and new field of multiple thermocouple production heretofore unknown.

One method of accomplishing the production of multiple thermocouples within foam is to utilize coarse granules of a conductor such as a boron carbide or equivalent and mold them along with low-carbon residue thermoplastic beads and a high-carbon residue resin. After baking this molded structure at extremely high temperatures to vaporize the beads, an open-cellular carbon foam structure is created wherein the granules form discrete conductors embedded within the foam. These conductors may not necessarily commute to the surface of the internal structure of the foam. In order to make more of the embedded conductors commute with the internal surfaces of the foam structure, one partially oxidizes the carbon foam, leaving a plurality of the embedded conductors exposed on the internal surfaces of the foam's cells. During operation of the thermocouple, electrical contact with the embedded material will be made by an ionized flame from combustion. This is done by utilizing such flame as a conductor. Because the foam is being used as a combustion containment medium and the ionized flame protrudes externally from the foamed structure, the flame acts as a contact with all the internal surfaces of the foamed thermocouple thereby contacting the discrete conductor granules embedded therein. The junction is completed using the carbon foam structure as the embedded conductors all contact the carbon foam which foam becomes one pole of the cell. The other pole is formed from a pole or screen contact with the ionized flame. In some embodiments it may become necessary to electrically insulate the carbon portion of the internal surface of the foam from the flame conductor. To accomplish this insulation, silicon vapor can be passed through the foam as the foam is being dielectrically heated which process will form a silicon carbide on the inside surfaces of the carbon foam. If some of the exposed surfaces of the boron carbide granules are also covered by a silicon carbide formation, then this silicon carbide may be removed by first placing the foamed structure in a vacuum. Then electron plasma in the foam is formed via a pole adjacent to the foam with the foam's carbon matrix being the second pole. The plasma conducts to any silicon carbide formed on the boron carbide granules as the underlying boron carbide granules are more conductive than the carbon foam which great heat will vaporize and re-expose the boron carbide as this path offers the least electrical resistance. As the plasma penetrates the foam, the silicon carbide over the boron carbide heats up because the silicon carbide acts as an insulator but only the silicon carbide formed over the boron carbide within the internal foam structure will vaporize or decompose and be carried away by the vacuum. The remaining silicon carbide formation will still cover and insulate the carbon foam section so that the ionized flame of combustion will contact and excite only the exposed boron carbide granules, and the remaining silicon carbide will act as an insulator of the carbon foam structure. Other methods to accomplish the best modes of creating foamed multiple thermocouples are disclosed in this application and reference is made to the accompanying drawings and description of the preferred emhodiments where such objects and methods will become more readily apparent.

DESCRIPTION OF THE PREFERRED EMBODIMENT(S)

Figure 1:
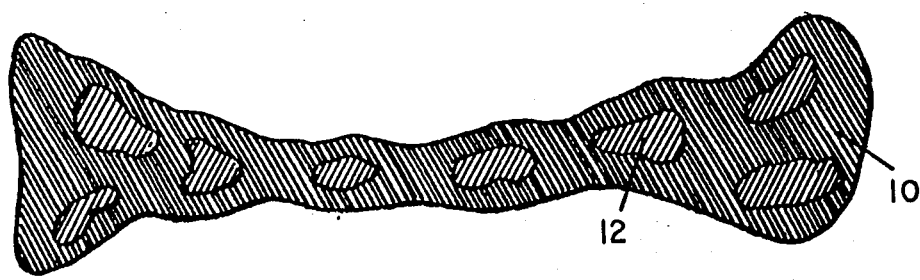
FIG. 1 illustrates a planar section of a foamed thermocouple with boron carbide granules embedded in the foam after carbonization and vaporization of the beads therefrom.
Figure 2:
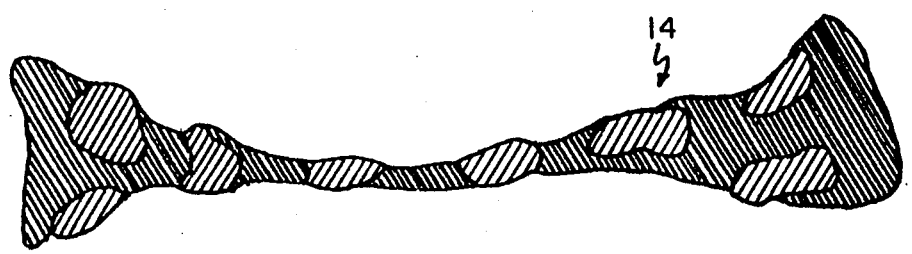
FIG. 2 illustrates a planar section of a foamed thermocouple after oxidation of the portion of the carbon to further expose the boron carbide granules.
Figure 3:
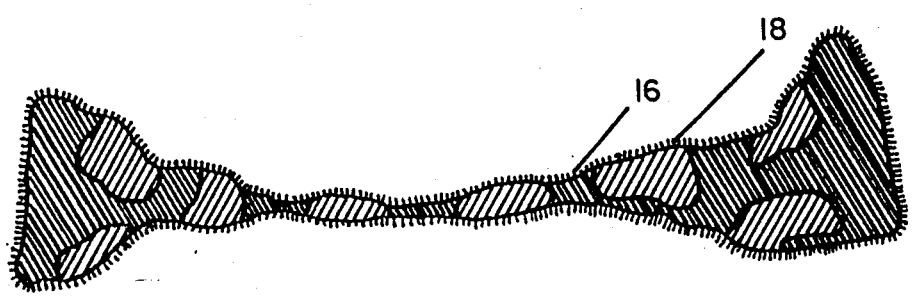
FIG. 3 illustrates a planar section of a foamed thermocouple after treatment with silicon vapor.
Figure 4:
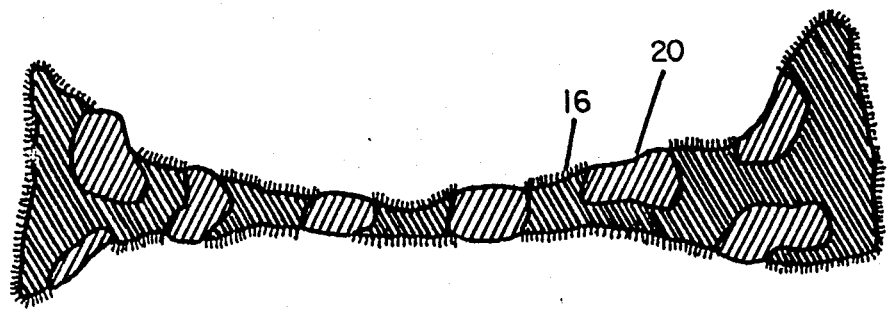
FIG. 4 illustrates a planar section of a foamed thermocouple after electron plasma treatment to remove silicon carbide from above the boron carbide granules.
Figure 5:
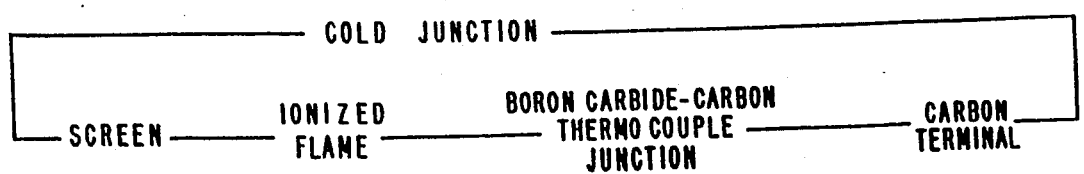
FIG. 5 illustrates a junction diagram of a typical cell of this invention.
Figure 6:
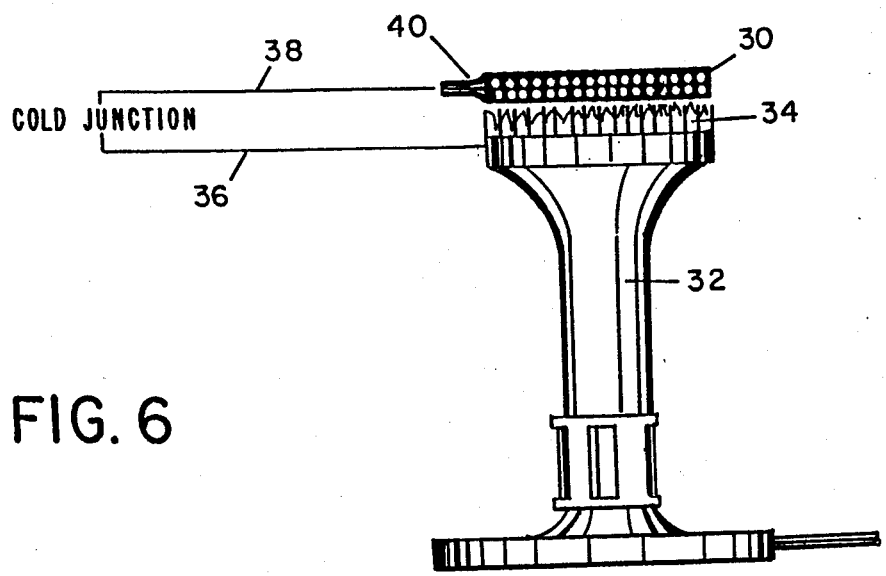
FIG. 6 illustrates a foamed thermocouple in an ionized flame of combustion to produce current.

In order to create a carbon foam, one can mix thermoplastic beads with a resin and bake this mixture at a temperature which vaporizes the beads while the same time carbonizing the resin to form an open-cellular foam structure. It is such a structure that is utilized in this invention. In producing a multiple thermocouple utilizing a foamed structure, one can mix in one method coarse granules of a conductor such as boron carbide or equivalent and mold the granules along with low-carbon residue thermoplastic beads and a high-carbon residue resin. After the foamed structure is carbonized by baking it at a high temperature, the thermoplastic beads are vaporized out of the structure and the high-carbon residue resin leaves a carbon structure containing the dissimilar conductors embedded in it as seen in FIG. 1. FIG. 1 shows a planar section of such a foam being a cross-section of a one-cell wall with carbon structure 10 and boron carbide granule 12 embedded therein. These boron carbide granules do not necessarily at this point make any contact with the outer surfaces of the inner cell walls of the carbon foam and in order for the thermocouple to work, one must have these embedded conductors be exposed within the internal cells of the foam. To accomplish this exposure, one can partially oxidize the carbon foam, leaving the embedded conductors exposed to the internal surfaces of the foam's cells as seen in FIG. 2 where a portion indicated as area 14 of carbon 10 has been oxidized away leaving the exposed boron carbide granules still held within the carbon foam of the cell. To electrically insulate the carbon structure of the internal surface of the foam from the ionized flame of combustion which forms the contact to the discrete conductors being in this example the exposed boron carbide granules, one can in one process coat the internal structure of the foam with a silicon vapor which can be passed through the foam as the foam is being dielectrically heated which vapor then combines with the carbon foam to form silicon carbide 16 on the surface of the carbon. Some of the silicon carbide 18 may be deposited on the exposed boron carbide granules. One can then place this foam structure in a vacuum and cause an electron plasma to form between a first pole adjacent to the foam with the foam's carbon matrix being the second pole. The plasma will complete the circuit and conduct through the silicon carbide formed on the boron carbide as the boron carbide is more conductive than the surrounding carbon matrix structure and this path of current flow offers the least electrical resistance. As seen in FIG. 4 the plasma penetrates the silicon carbide, heating it up as it forms an insulator on the carbon but the silicon carbide 20 formed on the boron carbide granule will decompose or vaporize and be carried away during the vacuum process. One then can operate the foam thermocouple of this invention by entering an ionized flame of combustion therein as illustrated diagramatically in FIG. 5 showing the junction with the carbon terminal being formed from the matrix of the foam and the boron carbide carbon junction with the exposed portion of boron carbide granules contacting the ionized flame entered therein having a pole member in contact therewith or passing through a screen contact pole over such ionized flame. The junction of the carbon foam terminal may be a portion of the carbon foam formed into a more solidified section to allow a lead to be attached thereto. FIG. 6 is a simplified structure showing the foamed thermocouple 30 above a burner 32 having a flame 34 make contact with a lead 36 and pass through the foam thermocouple where the second contact 38 is attached to the carbon matrix 40 of the foam.

Figure 7:
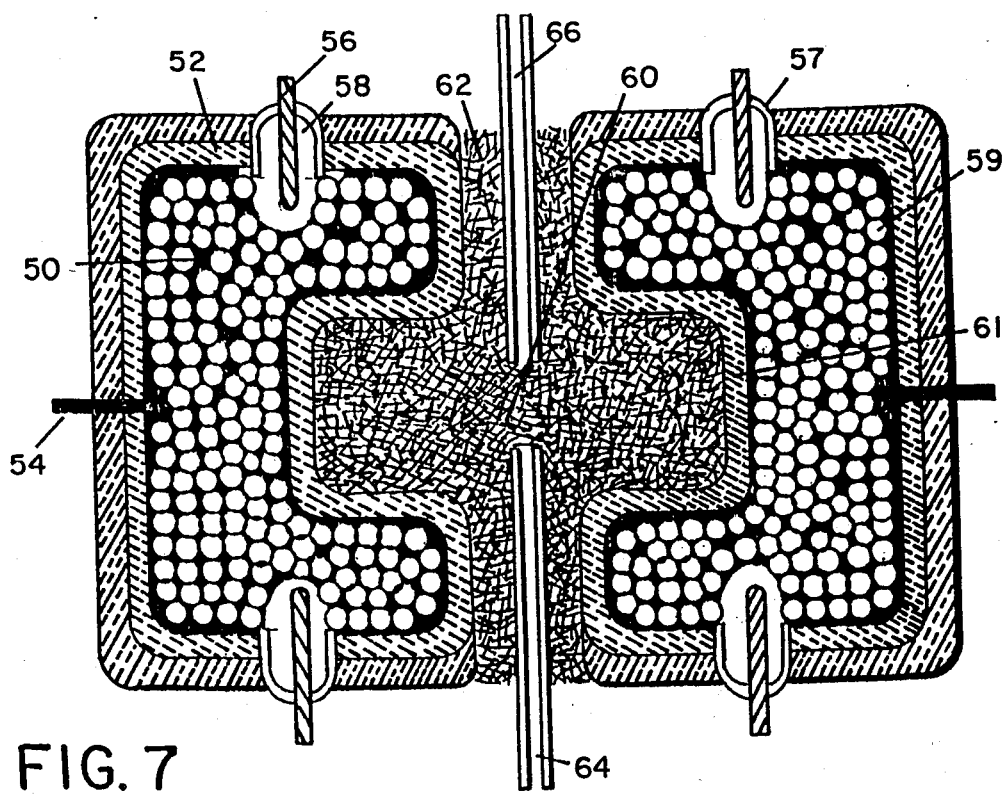
FIG. 7 illustrates a cell utilizing a foamed thermocouple to produce current upon the entry of an ionized flame of combustion therein.

A more complex cell utilizing such structure is seen in FIG. 7 wherein the foamed thermocouple material 50 is held within a container 52 and a first electrode 54 is formed from a protrusion of the carbon foam matrix with a second electrode 56 entered into a space within the open-cellular foam. A flame to produce heat can be entered into such a cell by means of a centrally located combustion area which can contain glass wool and have the fuel entered from a first port 64 and air to support the combustion entered from a second port 66.

This embodiment does not rely on electrical continuity being made through an ionized flame. Instead, the entire container 52 containing the foamed thermocouple material is filled with an electrically conductive medium 59 penetrating and contacting the insides of the foam. Examples of such conductive mediums are salt water, ammonium chloride solution, a conductive gas such as argon or equivalent, a vacuum, a solid material that was poured while in a liquid state into the unit and thus filling all the interstices of the foam before solidifying or a metal such as tin that can be molten during operation of the cell. These conductive mediums are only examples and other equivalent mediums to conduct electricity could be utilized. Dome 57 can be made of electrically insulative material so as to isolate pole 56 from the carbon foam matrix. Heat from the central combustion chamber 60 penetrates inner chamber wall 61 and into the foamed thermocouple 50 containing its electrolyte 59. The electrical path is made through pole 54 of the carbon foam matrix, through the discrete conductive particles in the foam, then from them through the electrolyte 59 to pole 56.

Figure 8:
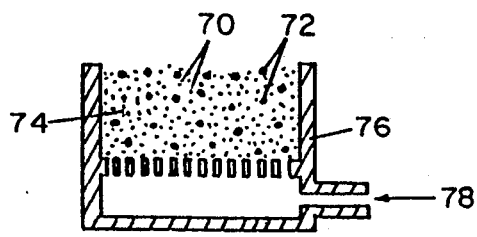
FIG. 8 illustrates a step of another method of creating a foamed carbon thermocouple where boron carbide granules are stuck around and embedded on the surface of thermoplastic beads.
Figure 9:
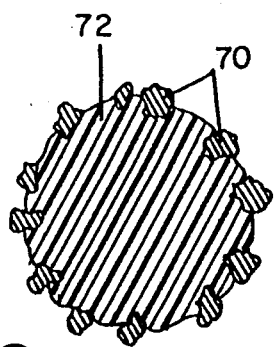
FIG. 9 illustrates boron carbide granules stuck to a thermoplastic bead.
Figure 10:
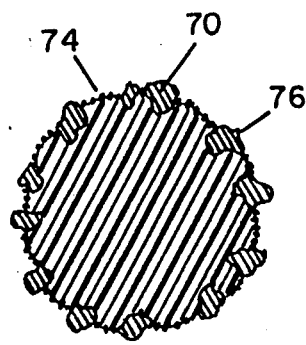
FIG. 10 illustrates the bead of FIG. 9 having silicon powder adhered thereon.
Figure 11:
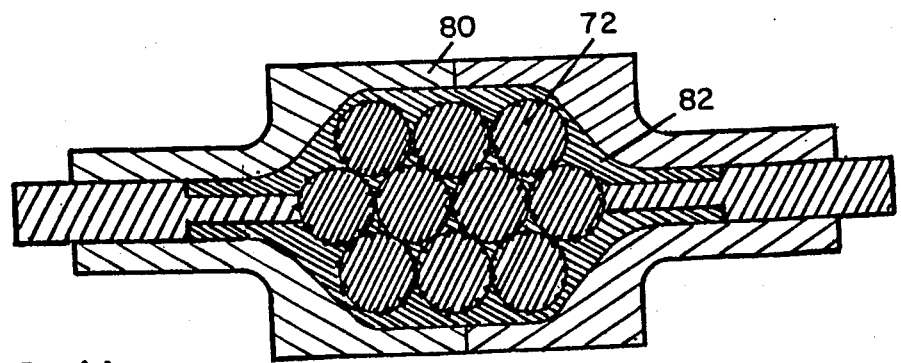
FIG. 11 illustrates beads placed along with a carbonizable thermosetting resin with the protruding portions of the boron carbide particles and the silicon powder contacting the curing resin.
Figure 12:
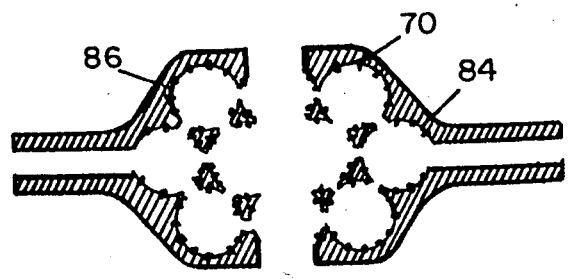
FIG. 12 illustrates a foam, after the beads have been vaporized out of the matrix by heat, showing the boron carbide granules embedded in the cell walls that have been created in the foam and silicon carbide formed on the inner surfaces of the foam between the boron carbide granules.
Figure 13:
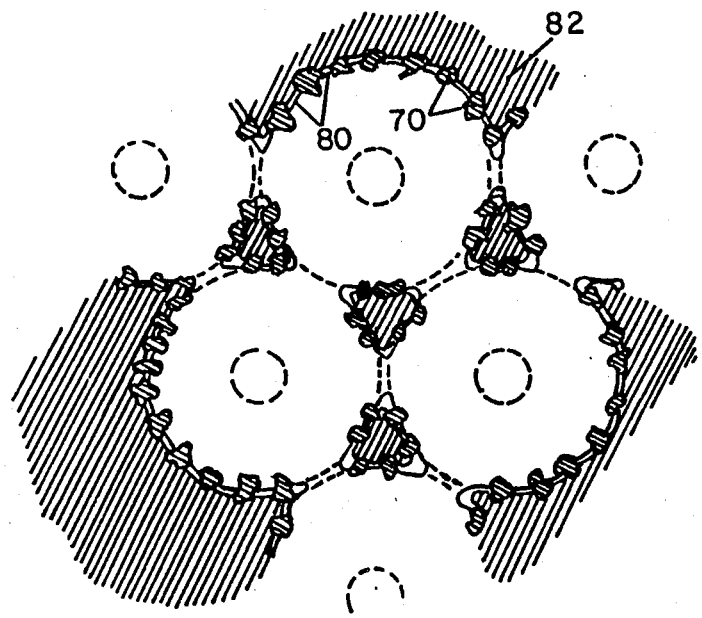
FIG. 13 illustrates a cross-section of a cell showing the boron carbide granules embedded in the foam matrix.
Figure 14:
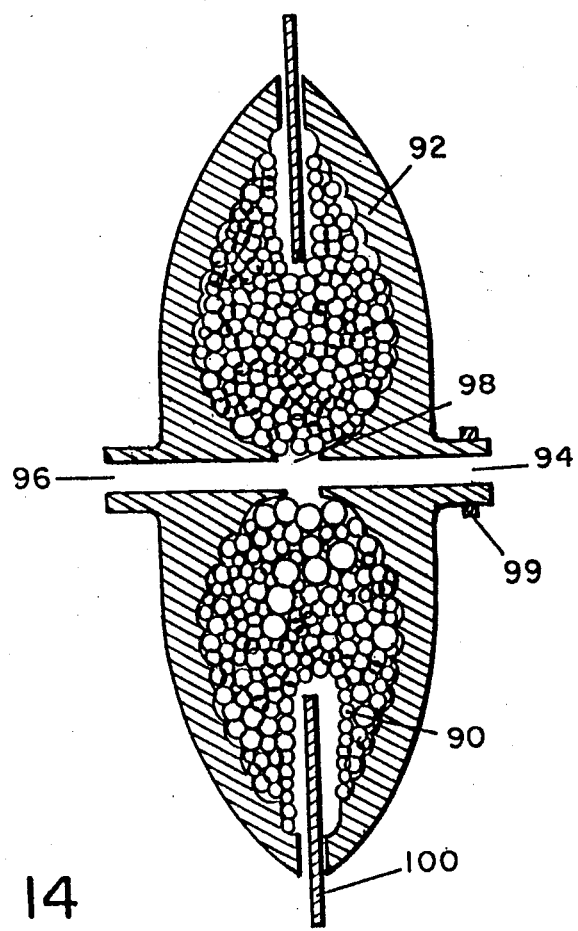
FIG. 14 illustrates a foamed thermocouple cell embodiment.

Another method of producing such a foam thermocouple structure utilizing a different method and technique of manufacture is shown in FIG. 8. The conductors 70 being boron carbide granules or equivalent are placed with the thermoplastic beads 72 in a fluid bed 76 where the temperature of a fluidizing gas 78 is raised to the softening point of the thermoplastic resin beads. At this point the boron carbide granules 70 will stick to and be embedded in the outer surface of each of the softened beads 72 as seen in FIG. 9. The temperature of the fluidizing bed is then lowered so that the boron carbide granules become rigidly affixed to the surface of the beads in which they are embedded as the beads reharden. The beads thus produced are then separated from the remaining unused portion of the boron granules by a screening classification method as to the size of the remaining granules, the boron carbide granules being much smaller than the plastic beads having boron carbide granules embedded therein. These boron carbide granule-embedded beads are then fluidized again along with a silicon powder by raising the temperature of the fluidizing gas to the thermoplastic softening point as before which now adheres the surrounding silicon powder 74 to the still exposed softened surface of the beads at all positions where there are no boron carbide granules as seen in FIG. 10. The silicon, though, does not adhere to the surface 76 of the boride granules. This adhering can be accomplished in the same kind of process as illustrated for adhering the boron carbide granules to the plastic beads. One then forms a mold 80 as seen in FIG. 11 and positions the beads with adhered silicon and boron particles within a carbonizable thermosetting resin 82 and these granules on the exterior of the beads now become surrounded by the curing resins, and the silicon powder is likewise compressed into the curing resin. Once molded, this structure is put through a carbonizing cycle and baked to a point where the thermoplastic beads being ones yielding no carbon residue are vaporized out of the carhon matrix and the boron granules are left embedded in the carbon cell walls 84 as well as the silicon powder being reacted with the carbon by the heat at the positions where there are no boron granules forming a silicon carbide 86 to act as an electrical insulator over the carbon foam as seen in FIG. 12. This method has certain advantages over the first disclosed method in that there is no silicon carbide formed on the granules that later has to be removed by a plasma. FIG. 13 is a planar cross-sectional view of a section of such a foam thermocouple with beads having been vaporized out of the carbon matrix showing the boron carbide granules 70 and the insulating silicon carbide 80 formed therebetween still allowing the boron carbide granules to have contact with the carbon 82 that retains them but yet not allowing any of the carbon matrix 82 to be exposed within the internal foam structure. In use, the ionized flames of combustion would also be entered into such structure as with the first method disclosed herein. FIG. 14 shows a particular cross-section of a saucer shape for such a cell to take advantage of the shape of the ionizing flame of combustion with the fuel entered through port 94 and air entered through port 96 to support the ionized flame of combustion which enters the foamed thermocouple 90 through port 98 with the carbon foam matrix 92 forming a first pole 99 and second pole 100 being a continuous disk extending into a space around the cell where it will be contacted by the ionized flame of combustion. It is felt that cells of these constructions having multiple thermocouple elements will produce an increased current dependent upon the number of the conductor granules embedded into the carbon matrix structure.

Although the present invention has been described with reference to particular embodiments, it will be apparent to those skilled in the art that variations and modifications can be substituted therefor without departing from the principles and spirit of the invention.

I claim:

1. A method of producing a multiple thermocouple comprising the steps of:
    mixing low-carbon residue beads with a plurality of discrete conductors and a high-carbon residue resin;
    forming said mixture into a shape;
    baking said mixture;
    vaporizing by said baking said beads;
    carbonizing by said baking said high-carbon residue resin;
    forming by said vaporization of said beads and carbonization of said resin an open-cellular foam matrix with said discrete conductors embedded therein; and
    partially oxidizing said foam matrix to remove carbon formed over said discrete conductors to expose them to the inside of said foam's cells.

2. The method of claim 1 further including the steps of:
    entering a silicon vapor into said foam matrix;
    dielectrically heating said foam to form said silicon vapor into a silicon carbide layer inside said foam's cells;
    placing said carbon foam matrix in a vacuum; and
    applying an electron plasma to vaporize out and remove the silicon carbide formed over said discrete conductors.

3. The method of claim 2 further including the steps of:
    entering an ionized flame of combustion into said foam matrix;
    forming a portion of said foam matrix into a first pole;
    placing a second pole in contact with said ionized flame of combustion; and
    utilizing said ionized flame of combustion as the conductor from said discrete conductors to said second pole.

4. A method of forming a multiple thermocouple comprising the steps of:
    softening low-carbon residue beads;
    embedding discrete conductors around the surface of said low-carbon residue beads having portions of the conductors protruding therefrom;
    molding a plurality of said beads in a high-carbon residue resin with said protruding portions of said conductors surrounded by and compressed into said resin;
    vaporizing said beads by high temperature;
    carbonizing said resin by said high temperature; and
    forming an open-cellular foam having said discrete conductors retained in said foam by the portions that protruded out of said beads and now protruding into said solidified carbon foam.

5. The method of claim 4 further including, before molding said beads in said resin, the steps of:
    resoftening said beads; and
    embedding powdered silicon around said beads everywhere there are no discrete conductors, said silicon, after carbonization of said resin, forming a silicon carbide layer around the inside of said cells except in places where said discrete conductors are located.

* * * * *